US009024486B2

(12) United States Patent
Wehrle et al.

(10) Patent No.: US 9,024,486 B2
(45) Date of Patent: May 5, 2015

(54) ADAPTABLE AUTOMATION CONTROL MODULE WITH INTEGRATED POWER BUS DISTRIBUTOR

(75) Inventors: David S. Wehrle, Chesterland, OH (US); Robert J. Hager, Windsor, OH (US); Joseph G. Vazach, Mentor, OH (US); Robert J. Kretschmann, Bay Village, OH (US); Nathan J. Molnar, Shaker Heights, OH (US); Gregg M. Sichner, Mentor, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 848 days.

(21) Appl. No.: 13/213,950

(22) Filed: Aug. 19, 2011

(65) Prior Publication Data
US 2012/0043830 A1    Feb. 23, 2012

Related U.S. Application Data

(60) Provisional application No. 61/375,587, filed on Aug. 20, 2010.

(51) Int. Cl.
*H01H 9/54* (2006.01)
*H01R 13/635* (2006.01)
(Continued)

(52) U.S. Cl.
CPC ............ *H01R 13/635* (2013.01); *H05K 7/1468* (2013.01); *H05K 7/1484* (2013.01); *H01R 13/629* (2013.01)

(58) Field of Classification Search
CPC .......................... H05K 7/1468; H05K 7/1484
USPC ........................................... 307/139; 439/709
See application file for complete search history.

(56) References Cited

U.S. PATENT DOCUMENTS

| 1,328,562 | A | * | 1/1920 | Cavanagh | 200/43.05 |
| 4,206,332 | A | * | 6/1980 | Veenendaal | 200/504 |
| 5,413,501 | A | * | 5/1995 | Munn | 439/535 |

(Continued)

FOREIGN PATENT DOCUMENTS

WO    2007073228    6/2007

OTHER PUBLICATIONS

U.S. Appl. No. 13/213,996, filed Aug. 19, 2011, Molnar.
(Continued)

*Primary Examiner* — Jared Fureman
*Assistant Examiner* — Joel Barnett
(74) *Attorney, Agent, or Firm* — Fletcher Yoder, P.C.

(57) ABSTRACT

Present embodiments include an adaptable automation control component that includes a base capable of communicatively coupling with a system bus and with a functional module that includes communication and control circuitry. The adaptable automation control component also includes a device power bus including electrical contacts that are capable of communicatively coupling the adaptable automation control component with a separate automation control component, and an activation mechanism including circuitry capable of continuing the device power bus when the activation mechanism is engaged, and capable of discontinuing the device power bus when the activation mechanism is disengaged. The adaptable automation control component facilitates functionality of the adaptable automation control component as an input/output module or a power distribution module depending on whether the activation mechanism is engaged or disengaged.

23 Claims, 7 Drawing Sheets

(51) Int. Cl.
*H05K 7/14* (2006.01)
*H01R 13/629* (2006.01)

(56) References Cited

U.S. PATENT DOCUMENTS

| | | | | |
|---|---|---|---|---|
| 5,641,313 | A * | 6/1997 | Hohorst | 439/709 |
| 5,716,241 | A | 2/1998 | Hennemann et al. | |
| 6,077,125 | A * | 6/2000 | Emery | 439/638 |
| 6,418,027 | B1 * | 7/2002 | Suzuki et al. | 361/729 |
| 7,491,096 | B1 * | 2/2009 | Correll | 439/716 |
| 2001/0034165 | A1 * | 10/2001 | Landis et al. | 439/716 |
| 2002/0182902 | A1 * | 12/2002 | Lostoski et al. | 439/76.1 |
| 2007/0297148 | A1 | 12/2007 | Gaub et al. | |
| 2008/0158788 | A1 * | 7/2008 | Darr et al. | 361/647 |

OTHER PUBLICATIONS

U.S. Appl. No. 13/214,072, filed Aug. 19, 2011, Molnar.
U.S. Appl. No. 13/213,921, filed Aug. 19, 2011, Vazach.
U.S. Appl. No. 13/213,991, Aug. 19, 2011, Molnar.
U.S. Appl. No. 13/214,027, filed Aug. 19, 2011, Bodmann.
U.S. Appl. No. 13/214,035, filed Aug. 19, 2011, Kretschmann.
Office Action for Chinese Application No. 201110245444.8 issued Mar. 4, 2014.

* cited by examiner

ADAPTABLE AUTOMATION CONTROL MODULE WITH INTEGRATED POWER BUS DISTRIBUTOR

CROSS REFERENCE TO RELATED APPLICATIONS

This application claims priority of U.S. Provisional Patent Application No. 61/375,587, filed Aug. 20, 2010, which is herein incorporated in its entirety by reference.

BACKGROUND

The invention relates generally to the field of automation control systems, such as those used in industrial and commercial settings. More particularly, embodiments of the present invention relate to techniques for providing, accessing, configuring, operating, and interfacing with configurable modular devices, such as configurable input/output (I/O) devices, that are capable of coupling and interfacing with an automation controller in a modular automation control system.

Automation controllers are special purpose computers used for controlling industrial automation and the like. Under the direction of stored programs, a processor of the automation controller examines a series of inputs (e.g., electrical input signals to the automation controller) reflecting the status of a controlled process, and changes outputs (e.g., electrical output signals from the automation controller) based on analysis and logic for affecting control of the controlled process. The stored control programs may be continuously executed in a series of execution cycles, executed periodically, or executed based on events.

The automation controller may function with other modular components of a control system to facilitate control or monitoring of a particular process. For example, inputs received by the automation controller from the controlled process and the outputs transmitted by the automation controller to the controlled process are normally passed through one or more I/O devices, which are components of the associated automation control system. The I/O devices generally serve as an electrical interface between the automation controller and the controlled process. Specifically, such I/O devices typically include a base configured to communicatively couple with a bus bar or the like (such that electrical signals can be transmitted therebetween), a terminal block with terminals or channels for connecting with wiring from field devices, and an I/O module that facilitates communication of information from the field devices to other automation controller components.

Traditional automation control systems receive power from a power source (e.g., an electrical grid or battery) through field power distribution (FPD) modules, which are specialized modules for providing power to components of the automation control system. Depending on the size and nature of a particular automation control system, different numbers and types of field power distribution modules may be required. Indeed, as modules (e.g., I/O modules) are connected with a power bus of a modular automation controller system, the type or amount of power may need to be changed or augmented. For example, in traditional systems, a particular type of FPD module may be required for powering analog I/O, and a different type of FPD module may be required for powering discrete I/O. Additionally, a single FPD module can only support a limited number of automation control system modules or devices. It is now recognized that system design and configuration is complicated by the necessity of including specialized FPD modules to accommodate system requirements. Accordingly, it is desirable to provide a more efficient process and system for providing power distribution that facilitates system configuration.

BRIEF DESCRIPTION

The present invention includes adaptable automation control component that includes a base configured to communicatively couple with a system bus and configured to couple with a functional module that includes communication and control circuitry. In some embodiments the base and functional module are integrated into a single base component. The adaptable automation control component also includes a device power bus including electrical contacts configured to communicatively couple the adaptable automation control component with a separate automation control component, and an activation mechanism including circuitry configured to continue the device power bus when the activation mechanism is engaged and to discontinue the device power bus when the activation mechanism is disengaged. The adaptable automation control component is configured to facilitate functionality of the adaptable automation control component as an input/output module or a power distribution module depending on whether the activation mechanism is engaged or disengaged.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
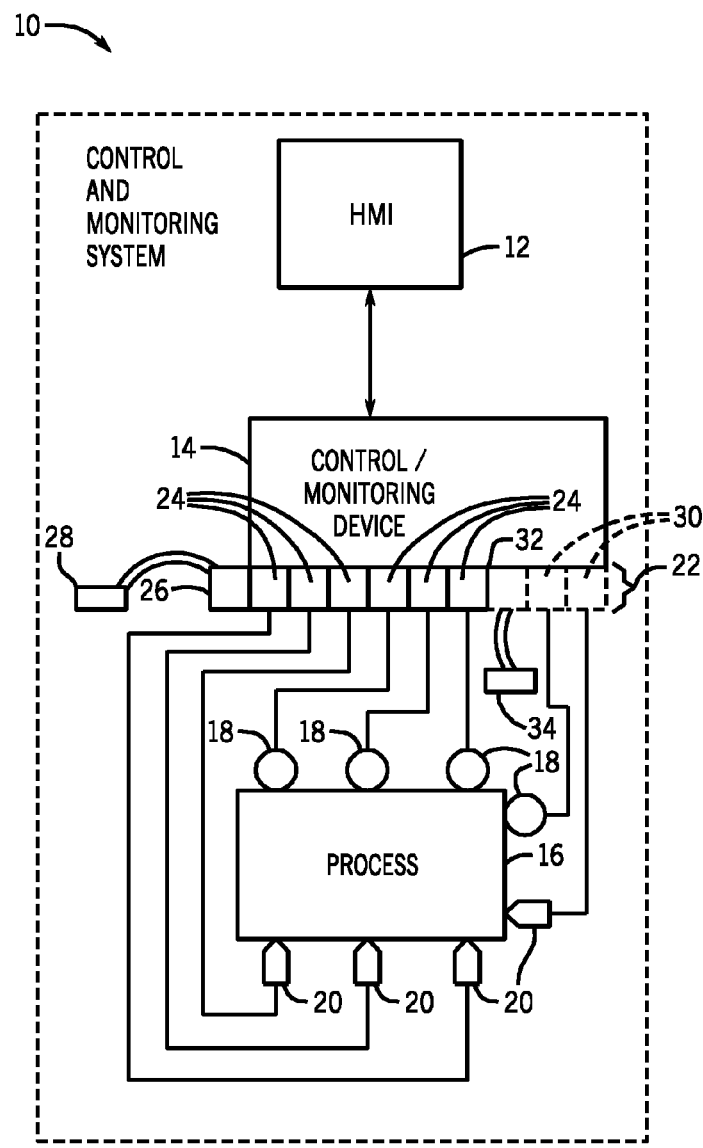
FIG. 1 is a diagrammatical representation of an exemplary control and monitoring system or automation controller system adapted to interface with networked components and configuration equipment in accordance with embodiments of the present techniques.

FIG. 1 is a diagrammatical representation of an exemplary control and monitoring system or automation controller system adapted to interface with networked components and configuration equipment in accordance with embodiments of the present techniques. The control and monitoring system of FIG. 1 includes components that have adaptable functionality in accordance with present techniques. Specifically, certain devices or modules of the control and monitoring system are capable of performing as an I/O device or as a power distribution device. Indeed, in accordance with present techniques, activation or deactivation of a selection mechanism on such adaptable devices enables different functionalities. For example, in one embodiment, a selection mechanism (e.g., a switch) on an adaptable device may default or be adjusted such that the adaptable device performs as an I/O device. That is, the adaptable device may be configured to receive inputs into and provide outputs from the associated automation control system. Alternatively, the selection mechanism may default or be adjusted such that the adaptable device performs as a power distributor. That is, the adaptable device may be configured to disconnect or block access to bus power from upstream components of the automation control system, receive power from an external voltage or power source (e.g., an electrical grid or battery), and provide power to downstream components of the automation control system.

In FIG. 1, the control and monitoring system 10 is generally indicated by reference numeral 10. Specifically, the control and monitoring system 10 is illustrated as including a human machine interface (HMI) 12 and a control/monitoring device or automation controller 14 adapted to interface with components of a process 16. It should be noted that such an interface in accordance with embodiments of the present techniques may be facilitated by the use of certain network strategies. Indeed, an industry standard network may be employed, such as DeviceNet, to enable data transfer. Such networks permit the exchange of data in accordance with a predefined protocol, and may provide power for operation of networked elements.

The process 16 may take many forms and include devices for accomplishing many different and varied purposes. For example, the process 16 may comprise a compressor station, an oil refinery, a batch operation for making food items, a mechanized assembly line, and so forth. Accordingly, the process 16 may comprise a variety of operational components, such as electric motors, valves, actuators, temperature elements, pressure sensors, or a myriad of manufacturing, processing, material handling and other applications. Further, the process 16 may comprise control and monitoring equipment for regulating process variables through automation and/or observation. For example, the illustrated process 16 comprises sensors 18 and actuators 20. The sensors 18 may comprise any number of devices adapted to provide information regarding process conditions. The actuators 20 may include any number of devices adapted to perform a mechanical action in response to a signal from a controller (e.g., the automation controller 14). The sensors 18 and actuators 20 may be utilized to operate process equipment. Indeed, they may be utilized within process loops that are monitored and controlled by the control/monitoring device 14 and/or the HMI 12. Such a process loop may be activated based on process inputs (e.g., input from a sensor 18) or direct operator input received through the HMI 12. As illustrated, the sensors 18 and actuators 20 are in communication with the control/monitoring device 14. Further, the sensors 18 and actuators 20 may be assigned a particular address in the control/monitoring device 14 and receive power from the control/monitoring device 14 or attached modules.

The control and monitoring system 10 includes one or more adaptable automation control components or adaptable devices 22 that are capable of functioning in different modes in accordance with present techniques. These adaptable devices 22 can function as input/output (I/O) devices when in a first mode, and as power distribution devices when in a second mode. In the illustrated embodiment, several of the adaptable devices 22 are configured to transfer input and output signals between the control/monitoring device 14 and the controlled process 16. The adaptable devices 22 configured for functioning in this manner are indicated as input/output (I/O) devices 24. As illustrated, the sensors 18 and actuators 20 may communicate with the control/monitoring device 14 via one or more of the I/O devices 24 coupled to the control/monitoring device 14. In another mode of operation, one or more of the adaptable devices 22 may be configured to perform a power distribution function. For example, power distribution device 26 represents one of the adaptable devices 22 that has been converted for functioning in such a mode. More particularly, the power distribution device 26 functions to receive power (e.g., 24V) from an external source 28 (e.g., an electrical grid or battery), and supply bus power to the other adaptable devices 22 (i.e., I/O devices 24). Power for the sensors 18 and actuators 20 (i.e., sensor actuator (SA) power) may also be provided by the power distribution device 26.

The adaptable devices 22 may be added or removed from the control and monitoring system 10 via expansion slots, bays or other suitable mechanisms. For example, as described in greater detail below, additional adaptable devices 22 configured as I/O devices may be included to add functionality to the control/monitoring device 14, or to accommodate additional process features (e.g., to communicate with new sensors 18 or actuators 20 added to control the process 16). The I/O devices 24 serve as an electrical interface to the control/monitoring device 14 and may be located proximate or remote from the control/monitoring device 14, including remote network interfaces to associated systems. Also, as described below, additional adaptable devices 22 configured as power distribution devices may be added to provide supplementary power when the power capabilities of one or more existing power distribution devices is exceeded. For example, an additional power distribution device may be added to accommodate the power requirements of additional I/O devices.

As indicated above, the I/O devices 24 are adaptable devices 22 that have been configured to function in a particular mode of operation. This configuration may be initiated by performing one or more reversible or irreversible operations. For example, one of the adaptable devices 22 may default to functioning as an I/O device, and activation of a selection mechanism on the adaptable device 22 may trigger configuration of the adaptable device as a power distribution device. For example, when the selection mechanism (e.g., a switch) of the adaptable device 22 is in a default position (e.g., the switch is closed), the adaptable device 22 may function as an I/O device, while when the selection mechanism is in a non-default position (e.g., the switch is open), the adaptable device 22 may function as a power distribution device. Thus, in accordance with present embodiments, the I/O devices 24 may include an activated or deactivated selection mechanism. Further, the I/O devices 24 may include input modules that receive signals from input devices such as photo-sensors and proximity switches, output modules that use output signals to energize relays or to start motors, and bidirectional I/O modules, such as motion control modules which can direct motion devices and receive position or speed feedback. In some embodiments, the I/O devices 24 may convert between AC and DC analog signals used by devices on a controlled machine or process and +5-volt DC logic signals used by the control/monitoring device 14. Additionally, some of the I/O devices 24 may function to provide digital signals to digital I/O devices and receive digital signals from digital I/O devices. Further, in some embodiments, the I/O devices 24 that are used to control machine devices or process control devices may include local micro-computing capability on a functional module of each of the I/O devices 24.

The I/O devices 24 in FIG. 1 receive power from the power distribution device 26, which is an adaptable device 22 modified to provide power distribution functionality. Adaptable devices, such as the illustrated adaptable devices 22, may be converted and employed as power distribution devices (e.g., the power distribution device 26) as needed or desired. Thus, when an additional power distribution module is desired for a particular control system, an adaptable device can be configured to function as the supplemental power distribution device and installed. For example, supplemental I/O devices 30 may be added to the control and monitoring system 10 to accommodate additional sensors 18 and actuators 20. Because the addition of these supplemental I/O devices 30 may exceed the power supply capacity of the existing power distribution device 26, an additional power distribution device 32 may be added between the last I/O device 24 and the next supplemental I/O device 30 to be added. More specifically, in accordance with present embodiments, an adaptable device 22 may be converted or configured to function in a power distribution mode and then added to the control and monitoring system 10 as the power distribution device 32. The supplemental I/O devices 30 may also be adaptable devices 22 that are configured to provide the functionality of an I/O device.

In operation, the additional power distribution device 32 will disconnect bus power between the I/O modules 24, 30 that are adjacent to the supplemental or additional power distribution device 32. Indeed, the additional power distribution device 32 may have been activated to discontinue a device power bus within the power distribution device 32. Thus, the additional power distribution device 32 breaks the bus power connection with system components arranged to the left (e.g., upstream) of the newly added power distribution module 26, and allows connection of another source voltage 34 for providing power to devices attached on the right (e.g., downstream) of the added power distribution module 32. In certain embodiments, components that are electrically upstream of a particular adaptable device 22 are components that are on a left side of the adaptable device 22 when viewing the adaptable device 22 from the front, and components that are electrically downstream of the adaptable device 22 are components that are on a right side of the adaptable device 22 when viewing the adaptable device 22 from the front. However, in other embodiments, the upstream and downstream electrical coupling aspects may be configured differently.

Present embodiments facilitate efficient configuration of control and monitoring systems (e.g., control and monitoring system 10) by providing adaptable devices (e.g., adaptable devices 22) that can function as either I/O devices (e.g., I/O devices 24, 30) or as power distribution devices (e.g., power distribution devices 26, 32). Indeed, present embodiments provide customers and technicians with the ability to assemble and maintain certain portions of a control and monitoring system by simply acquiring a number of the same type of module or device. Because the adaptable devices 22 can function as either I/O devices or power distribution devices, a single type of device (e.g., adaptable device 22) can be acquired for system configuration and inventoried for maintenance purposes without requiring the determination of a specific number of power distribution devices and I/O devices to include in a system or store as backup. This will improve system assembly and maintenance logistics because customers and technicians will be able to order and maintain an inventory of the same system components that can function as replacements for two different functional components of a control system.

In the illustrated embodiment, the adaptable devices 22 (i.e., I/O devices 24, 30 or power distribution devices 26, 32) are coupled directly to the control/monitoring device 14. However, it should be noted that, in some embodiments, the adaptable devices 22 may be located in close proximity to aspects of the control and monitoring system 10, and away from the control/monitoring device 14. In such embodiments, data may be communicated with remote modules over a common communication link, or network, wherein modules on the network communicate via a standard communications protocol. Many industrial controllers can communicate via network technologies such as Ethernet (e.g., IEEE802.3, TCP/IP, UDP, EtherNet/IP, and so forth), ControlNet, DeviceNet or other network protocols (Foundation Fieldbus (H1 and Fast Ethernet) Modbus TCP, Profibus) and also communicate to higher level computing systems.

Figure 2:
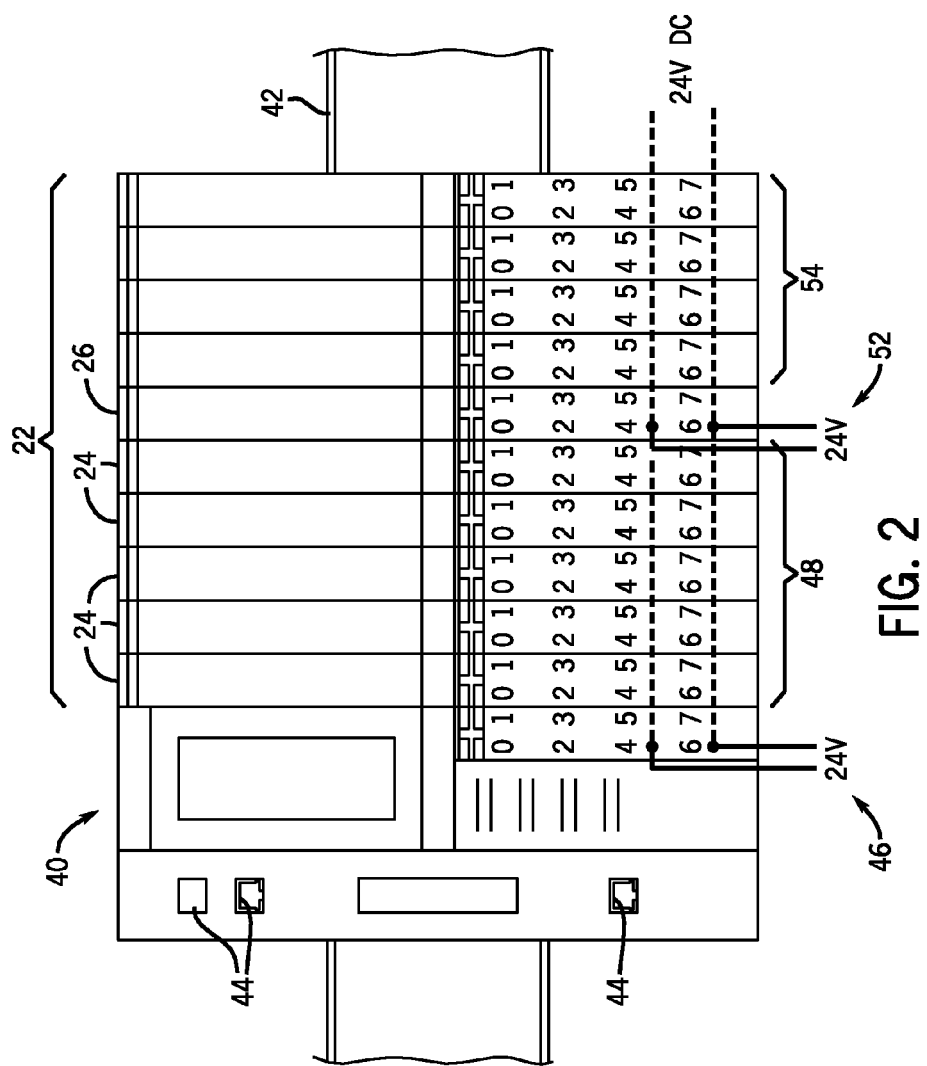
FIG. 2 is a front view of a plurality of adaptable devices communicatively or electrically coupled to an I/O adapter in accordance with embodiments of the present techniques.

FIG. 2 is a front view of a plurality of adaptable devices 22 communicatively or electrically coupled to an I/O adapter 40 in accordance with embodiments of the present techniques. As illustrated, the I/O adapter 40 and the plurality of adaptable devices 22 are mounted to a bus bar or system bus (e.g., a DIN rail) 42, which is an industry standard support rail for mounting control equipment in racks and cabinets. As described in greater detail below, the plurality of adaptable devices 22 are electrically or communicatively coupled in series along the bus bar 42 such that field power and system information and power may be communicated between the adaptable devices 22, and back through the I/O adapter 40 to the control/monitoring device 14 via one or more communication ports 44. The I/O adapter 40 is configured to enable conversion between the communications protocols of the adaptable devices 22 and the control/monitoring device 14. Thus, the I/O adapter may function as a data translator between the adaptable devices 22 and the control/monitoring device 14. For example, in one embodiment, the I/O adapter 40 may receive data from certain of the adaptable devices 22 that are configured to function as I/O devices, translate the data from a first protocol to a second protocol, and communicate the translated data to the control/monitoring device 14 via the one or more communication ports 44 communicatively coupled with the control/monitoring device 14.

The I/O adapter 40 also receives a source voltage 46 and provides power to a subset of the illustrated adaptable devices 22. Indeed, a first set 48 of five of the adaptable devices 22 to the right of the I/O adapter 40 includes adaptable devices 22 (indicated as the I/O devices 24) that are configured to provide I/O functionality. These I/O devices 24 receive sufficient power from the I/O adapter 40. However, the I/O adapter 40 may only be equipped to provide five I/O devices 24 with sufficient power. Accordingly, the sixth adaptable device 22 to the right of the I/O adapter 40 has been converted to provide power distribution functionality, and is referred to as the power distribution device 26. The power distribution device 26 receives a source voltage 52, provides power to a second set 54 of four I/O devices 24 that are downstream of the power distribution device 26, and disconnects device bus power between the first set 48 and second set 54 of I/O devices 24.

It should be noted that the power distribution device 26 has the same general appearance as the I/O devices 24. This is because, like the I/O devices 24, the power distribution device 26 is essentially an adaptable device 22 (which may have a default function as an I/O device or as a power distribution device). Indeed, the power distribution device 26 may have been converted from an I/O device 24, or vice versa. In some embodiments, as will be discussed below, certain visible aspects of the adaptable devices 22 may be changed when functionality is established to facilitate distinguishing I/O devices from power distribution devices. For example, converting an adaptable device 22 from a default functionality as an I/O device 24 to a power distribution device 26 may include removing a component (e.g., a tab) that provides a clear visible distinction or activating one or more light emitting diodes that indicate the mode of operation of the adaptable device 22.

Figure 3:
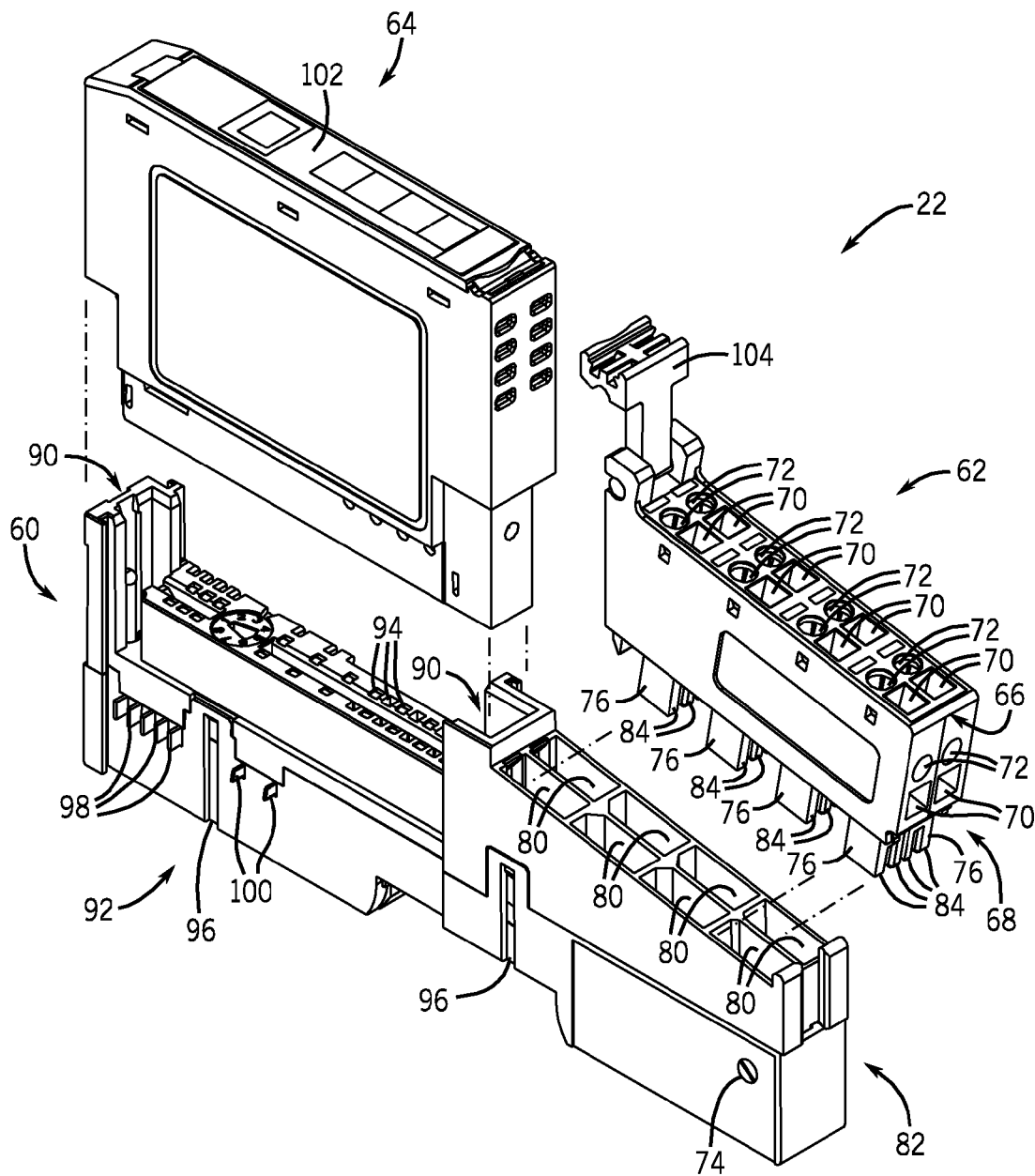
FIG. 3 is an exploded perspective view of an exemplary adaptable device in accordance with embodiments of the present techniques.

FIG. 3 is an exploded perspective view of an exemplary adaptable device 22 in accordance with embodiments of the present techniques. The adaptable device 22 includes a base 60, a terminal block 62, and a functional module 64. The base 60 is configured to physically and communicatively connect the adaptable device 22 to adjacent devices and the system bus or bus bar 42. The terminal block 62 (which, in certain embodiments, may be removable from the base 60) is configured for electrically connecting the adaptable device 22 to field devices (e.g., sensors or actuators) or a power source (e.g., power source 28), depending on the embodiment and the mode of operation of the adaptable device 22. The functional module 64, which includes communication and control circuitry (e.g., I/O communication circuitry, control circuitry, power distribution circuitry, and/or logic), is configured to provide a selectable functionality. In general, when an adaptable device 22 is functioning as an I/O device 24, the functional module 64 of the adaptable device 22 is capable of receiving input signals from field devices via the terminal block 62, delivering output signals to the field devices via the terminal block 62, performing general and/or specific local functionality on the inputs and/or outputs, communicating the inputs and/or outputs to the control/monitoring device 14 and/or the other I/O devices 24, and so forth. When the adaptable device 22 is functioning as a power distribution device 26, the module 64 and/or other components of the adaptable device 22 may coordinate to perform a power distribution functionality by receiving power from a source via the terminal block 62, disconnecting from upstream bus power via a switch or the like in the base 60, terminal block 62, and/or functional module 64, and providing bus power to downstream devices via the base 60, terminal block 62, and/or functional module 64. It should be noted that, in some embodiments, the functional module 64 may be integral with the base 60. In other words, the base 60 and the functional module 64 may be combined into a single base component.

In the embodiment illustrated in FIG. 3, the terminal block 62 is a removable terminal block that may be physically connected and electrically coupled to the base 60 during assembly of the adaptable device 22, and physically disconnected and electrically decoupled during disassembly (e.g., for servicing) of the adaptable device 22. The removable or detachable nature of the illustrated terminal block 62 enables replacement of the base 60 or the functional module 64 without the need for re-wiring. However, as described above, in other embodiments, the terminal block 62 may be directly integrated with the base 60. Such integrated embodiments may be desirable, for example, in process automation control applications for which the specific arrangement of electrical connections may be somewhat complex or compact, and the ability to maintain these electrical connections or a correspondence between components during servicing is of greater importance.

As illustrated, the terminal block 62 includes eight terminals 66 (i.e., channels) for connecting field device wiring or power source wiring. In operation, when the adaptable device 22 is functioning as an I/O device, the terminals 66 may each be associated with a particular input to or output from a field device. When the adaptable device 22 is in a power distribution device configuration, two or more of the eight terminals 66 may function as a coupling to a voltage source (e.g., the external source 28). In other embodiments, the terminal block 62 includes dedicated terminals 68 for use as a coupling to a voltage source when the adaptable device 22 is functioning in a power distribution configuration. In some embodiments, activating the adaptable device 22 with a power distribution functionality includes exposing (e.g., by removing a tab or key) these dedicated terminals 68, which provides a visual indication of the functionality of the adaptable device 22.

As illustrated, each terminal 66 includes a terminal opening 70 into which a field wire (i.e., wiring electrically connected to a field device) may be inserted, or a power source wire connected to a power source may be inserted. Further, each terminal 66 includes an attachment activator (e.g., a terminal screw) 72, which when activated (e.g., tightened) causes a clamp or other electrical wiring connection mechanism within the terminal block 62 to tighten around an end of a field wire or power source wire that has been inserted into the associated terminal opening 72. Similarly, the dedicated terminals 68 may include terminal openings 70 and attachment activators 72. In some embodiments, the dedicated terminals 68 may only become active when an activation mechanism 74 (e.g., a switch or circuit bridge) of the adaptable device 22 is activated or deactivated (e.g., removed, turned, or toggled). In the illustrated embodiment, the activation mechanism 74 includes a rotatable switch disposed on the base 60. In other embodiments, the activation mechanism 74 may include different features and may be disposed on different components of the adaptable device 22. The illustrated activation mechanism 74 is configured to complete or break contact with circuitry of the adaptable device 22 such that the adaptable device functions as either an I/O device or a power distribution device. For example, when the activation mechanism 74 is in a particular orientation, internal circuitry may disengage from or engage with a device power bus such that power from any upstream devices will or will not be received and/or such that certain power input terminals become active or inactive. In other words, when the activation mechanism 74 engages with the device power bus, the device power bus may be continued such that power is allowed to flow through the adaptable device 22, while when the activation mechanism 74 disengages from the device power bus, the device power bus may be discontinued such that power flow is broken. Thus, the activation mechanism 74 may be utilized to break or continue SA power.

As illustrated in FIG. 3, each of the terminals 66 terminates at the bottom of the terminal block 62 with a terminal block connector 76, which may be inserted into terminal block connector openings 80 in the top of a terminal block bay 82 of the base 60 to physically and communicatively connect the terminal block 62 with the base 60. In the illustrated embodiment, each of the terminal block connectors 76 include two opposing electrical prongs 84 that slide around and electrically connect with a single electrical prong (not shown) in the respective terminal block connector opening 80 of the terminal block bay 82 of the base 60. However, in other embodiments, other types of terminal block connectors 76 may be used to electrically connect with mating electrical connectors in the respective terminal block connector opening 80 of the terminal block bay 82 of the base 60.

The functional module 64 may also be physically and communicatively connected to the base 60 by inserting the functional module 64 into a mating slot 90 in a module bay 92 of the base 60. As noted above, in other embodiments, the functional module 64 may be integral with the base 60 such that attachment of these two components is unnecessary. With regard to the illustrated embodiment, when the module 64 is inserted into the slot 90 in the module bay 92 of the base 60, the module 64 becomes electrically or communicatively coupled to the terminals 70 of the terminal block 62 via internal circuitry within the base 60 that electrically connects the electrical prongs (or other suitable electrical connectors) in the terminal block connector openings 80 to respective electrical outlets 94 in the top of the module bay 92 of the base 60. The electrical outlets 94 for each channel are in turn electrically coupled to the functional module 64 via respective electrical connectors (not shown) that, in certain embodiments, extend from the bottom of the functional module 64. As such, the terminal block 62, the base 60, and the functional module 64 are all electrically and communicatively coupled together. Accordingly, when the adaptable device 22 is configured as an I/O device 24, signals to and from a field device to which the I/O device 24 is connected can be shared between the terminal block 62, the base 62, and the functional module 64, which is acting as an I/O module. Likewise, when the adaptable device is configured as a power distribution device 26, power from a voltage source can be shared among and transmitted by the terminal block 62, the base 62, and/or the functional module 64.

In certain embodiments, adjacent adaptable devices 22 may be physically attached to each other via one or more connection features (e.g., slots) 96 of the base 60 on one of the sides (e.g., the left side of the illustrated embodiment) of the adaptable device 22 near the bottom of the base 60, and corresponding mating connection features such as protrusions (not shown) on the opposite side (e.g., the right side of the illustrated embodiment) of the base 60 of the adaptable device 22 near the bottom of the base 60. In certain embodiments, connection features of the adaptable device 22 may slide into mating connection features of an adjacent adaptable device 22, thereby physically attaching the adjacent adaptable devices 22, whether the adaptable devices 22 are in an I/O mode of operation or a power distribution mode of operation.

When adjacent adaptable devices 22 are physically attached to each other, system electrical contacts 98 on the base 60 on one of the sides (e.g., the left side of the illustrated embodiment) align with and are electrically coupled to mating electrical contacts (not shown) on the base 60 on the opposite side (e.g., the right side of the illustrated embodiment) of an adjacent adaptable device 22. Similarly, field electrical contacts 100 on the base 60 on one of the sides (e.g., the left side of the illustrated embodiment) align with and are electrically coupled to mating electrical contacts (not shown) on the base 50 on the opposite side (e.g., the right side of the illustrated embodiment) of an adjacent adaptable device 22. In the illustrated embodiment, the adaptable device 22 includes five system electrical contacts 98 and two field electrical contacts 100. In such an embodiment, system power may be electrically communicated between electrically connected adaptable devices 22 via two of the system electrical contacts 98, while the three other system electrical contacts 98 are used for transmission of data (e.g., relating to signals transmitted to and from the field devices to which the adaptable devices 22 may be electrically connected) between the electrically connected adaptable devices 22 and other system components (e.g., the I/O adapter 24 or the control/monitoring device 14). In addition, the two field electrical contacts 100 may be used to electrically communicate power to field devices to which the adaptable devices 22 may be electrically connected. However, it will be understood that the specific number of system electrical contacts 98 and field electrical contacts 100 may vary between implementations depending on the requirements for power and data transmission of the adaptable devices 22. Electrical contacts such as the field electrical contacts 100 or the system electrical contacts 98 may include extensions from the device power bus, which is essentially an integrated power bus in accordance with present embodiments.

As illustrated, in certain embodiments, the functional module 64 may include a status display 102 on the top face of the functional module 64 for displaying operating status information of the adaptable device 22. The status display 102 may, for example, include status light emitting diodes (LEDs) corresponding to each of the terminals 66, 68 of the terminal block 62. The status display 102 may include certain features that provide an indication of whether the adaptable device 22 is functioning as an I/O device or a power distribution device. For example, when an activation mechanism is triggered and/or a power supply is coupled to the dedicated terminals 68, an LED or group of LEDs may be activated to provide notice that the adaptable device 22 is functioning as a power distribution device.

The various communicative connections between the components of the adaptable device 22 also physically hold the adaptable device 22 together. In addition, in certain embodiments, once the terminal block 62 and the functional module 64 are physically and communicatively connected to the base 60 of the adaptable device 22, a latch 104 or other fastening device extending from the terminal block 62 may further attach the terminal block 62 to the functional module 64, thereby providing additional structural support and stabilizing the electrical connections between the terminal block 62, the functional module 64, and the base 60. In some embodiments, this latch 104 may also include certain electrically functional or communicative aspects. For example, engaging the latch 104 with the functional module 64 may complete or break a circuit and activate some operational feature of the adaptable device. Indeed, in some embodiments, aspects of the latch 104 may incorporate the activation mechanism 74. In some embodiments, the latch 104 extends from the base 60 or the functional module 64.

Figure 4:
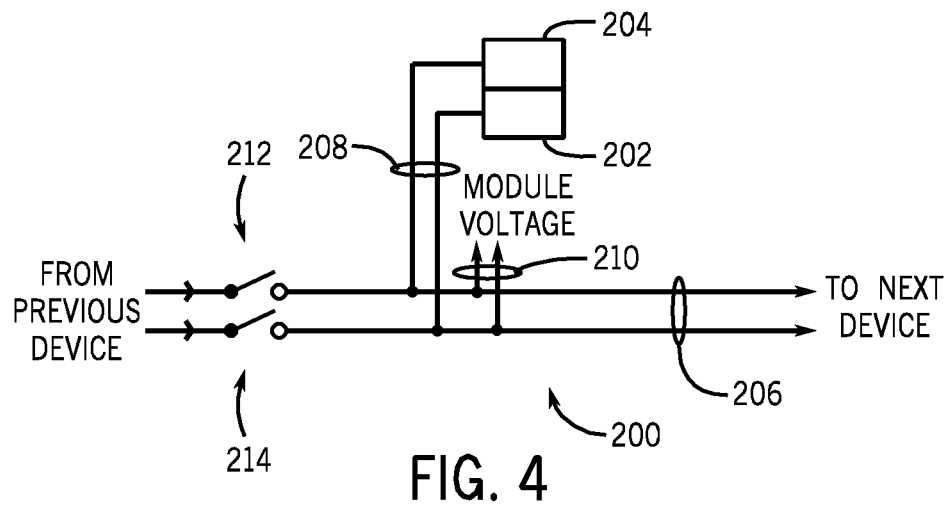
FIG. 4 is a schematic representation of communicative features of an adaptable device in accordance with present techniques, wherein an activation mechanism of the adaptable device includes a double-pole single throw switch.

FIG. 4 is a schematic representation of communicative features of an adaptable device 200 in accordance with present techniques. The adaptable device 200 includes a first terminal 202 and a second terminal 204 in a terminal block (e.g., a removable terminal block), base, or functional module of the adaptable device 200. The terminals 202, 204 are configured to facilitate communicative coupling of the adaptable device 200 with power (e.g., 12/24V DC). The first terminal 202 may be configured as a common terminal and the second terminal 204 may be configured as a voltage terminal. It should be noted that the terminals 202, 204 may be dedicated terminals (e.g., terminals 68 of FIG. 3) that are only used when the device 200 is being utilized as a power distribution device. However, in other embodiments, the terminals 202, 204 may be utilized for I/O functionality when the adaptable device 200 is being utilized as an I/O device. Indeed, conversion of the adaptable device 200 to one or another type of functionality may include changing an electrical configuration of the terminals 202, 204 or circuitry coupling the terminals 202, 204 to other aspects of the adaptable device 200. In the illustrated embodiment, the terminals 202, 204 are dedicated power terminals and are linked to a device power bus 206 via input lines 208. The device power bus 206 is integral with the adaptable device 200 and can communicatively extend to other device power buses in attached devices. Power requirements of the adaptable device 200 (e.g., a functional module of the adaptable device 200) may be acquired from the device power bus 206 via module voltage lines 210.

The adaptable device 200 also includes an activation mechanism 212 disposed along the device power bus 206 such that the activation mechanism 212 can continue or discontinue the device power bus 206. Specifically, in the illustrated embodiment, the activation mechanism 212 includes a double-throw switch 214 that can be activated or deactivated to change functionality of the adaptable device 200. For example, when the adaptable device 200 is acting as a power distribution device, the switch 214 can be opened to break a communicative coupling of the device power bus 206 with any upstream power distribution devices. Power to devices downstream of the adaptable device 200 may then be provided from the terminals 202, 204 via the device power bus 206. Alternatively, when the adaptable device 200 is acting as an I/O device, the switch 214 can be closed to continue the device power bus 206 such that the adaptable device 200 can receive power for its I/O functionality from an upstream power distribution device. Specifically, power from an upstream power distribution device can be received via the device power bus 206 and utilized by components (e.g., a functional module) of the adaptable device 200 via the module voltage lines 210. Further, when the switch 214 is closed, power from the upstream power distribution device can pass through the adaptable device 200 to downstream devices and/or field components via the device power bus 206. As an example, components of the device power bus 206 may include connectors such as system electrical contacts 98 and/or field electrical contacts 100, as illustrated in FIG. 3.

In the embodiment illustrated by FIG. 4, the activation mechanism is the double-pole single throw switch 214. However, in other embodiments, different types of switches may be employed. For example, in FIG. 5, the activation mechanism 212 includes a double hermaphroditic switch 216, which is a reversible switch that can be rotated to make or break coupling of the device power bus 206 by moving contacts of the switch 216.

Figure 5:
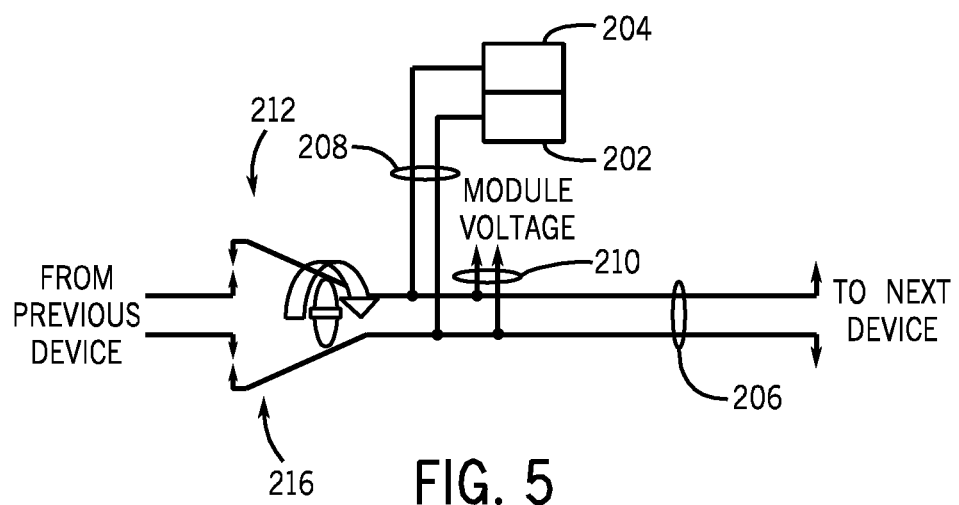
FIG. 5 is a schematic representation of communicative features of an adaptable device in accordance with present techniques, wherein an activation mechanism of the adaptable device includes a double hermaphroditic switch.
Figure 6:
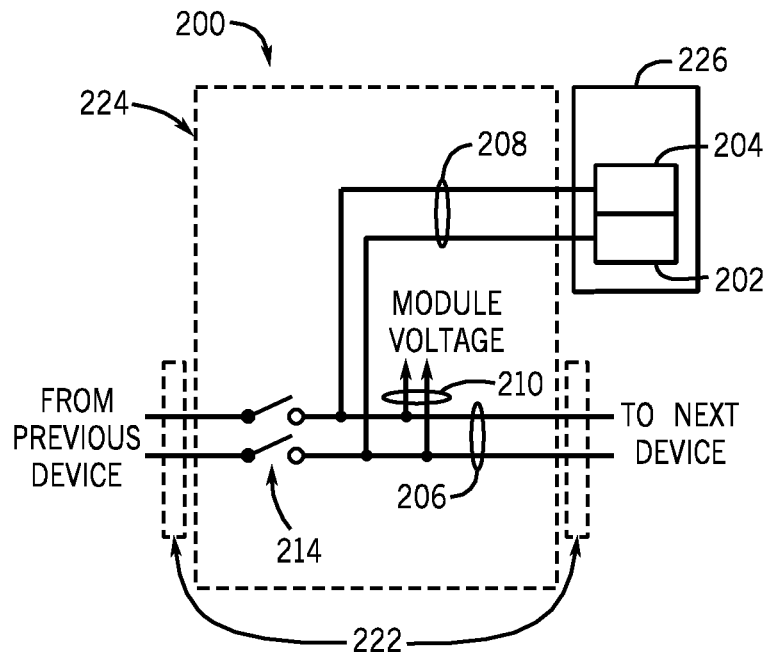
FIG. 6 is a schematic representation of communicative features of an adaptable device in accordance with present techniques, wherein an activation mechanism of the adaptable device is disposed within a functional module of the adaptable device.
Figure 7:
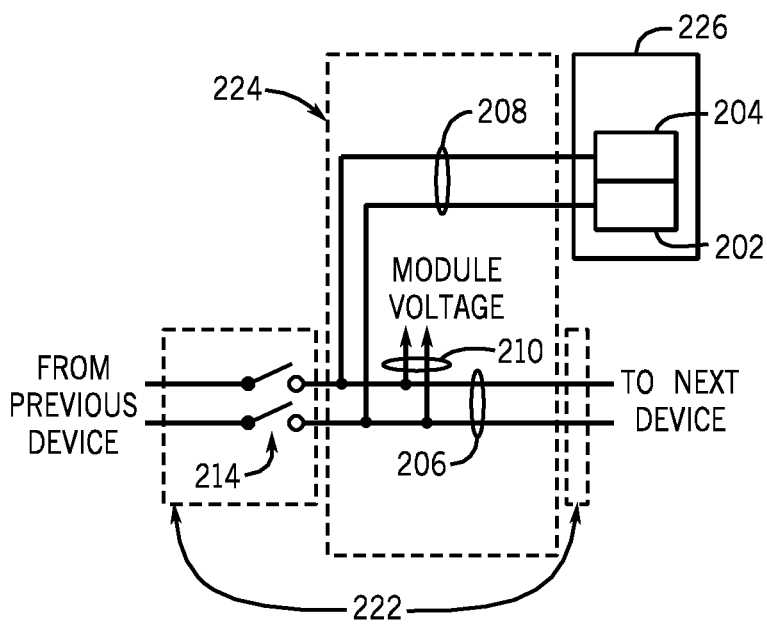
FIG. 7 is a schematic representation of communicative features of an adaptable device in accordance with present techniques, wherein an activation mechanism of the adaptable device is disposed within a base of the adaptable device.

It should be noted that the activation mechanism 212 may be disposed in one of the various components of the adaptable device 200 (e.g., the base 60, the terminal block 62, or the functional module 64, as illustrated in FIG. 3). In FIGS. 4 and 5, the activation mechanism 212 is merely represented as being a component of the adaptable device 200. However, FIGS. 6 and 7 illustrated embodiments of the adaptable device 200, wherein the activation mechanism 212 is located in specific components of the adaptable device 200, which may facilitate servicing or configuration of the adaptable device 200. For example, the adaptable device 200 is illustrated in FIG. 6 as including a base 222, a functional module 224, and a removable terminal block 226, wherein the switch 214 is a component of the functional module 224. As another example, FIG. 7 illustrates the adaptable device 200 including the base 222, the functional module 224, and the removable terminal block 226, wherein the switch 214 is a component of the base 222.

In the embodiments illustrated by FIGS. 4-7, the activation mechanism 212 of the adaptable device 200 may enable reversible activation/deactivation of modes of operation. For example, when the adaptable device 200 is to be utilized as an I/O device, the switch 214 or the switch 216 may be closed, and when the adaptable device is to be utilized as a power distribution device, the switch 214 or switch 216 may be opened. Thus, in some embodiments wherein the switch 214 or the switch 216 is utilized, if it becomes desirable to convert from one functionality to another, the switch 214 or the switch 216 can simply be reversed (i.e., opened or closed) to change the functionality of the adaptable device 200. However, in other embodiments, different selection mechanisms may be employed. Indeed, a selection mechanism may not only mechanically function in a different manner than the switch 214 or the switch 216, it may also function such that once it is activated the activation is essentially irreversible. In other words, while an improperly utilized mechanism could be used to complete the circuit, it would be unintended and an incorrect usage.

Figure 8:
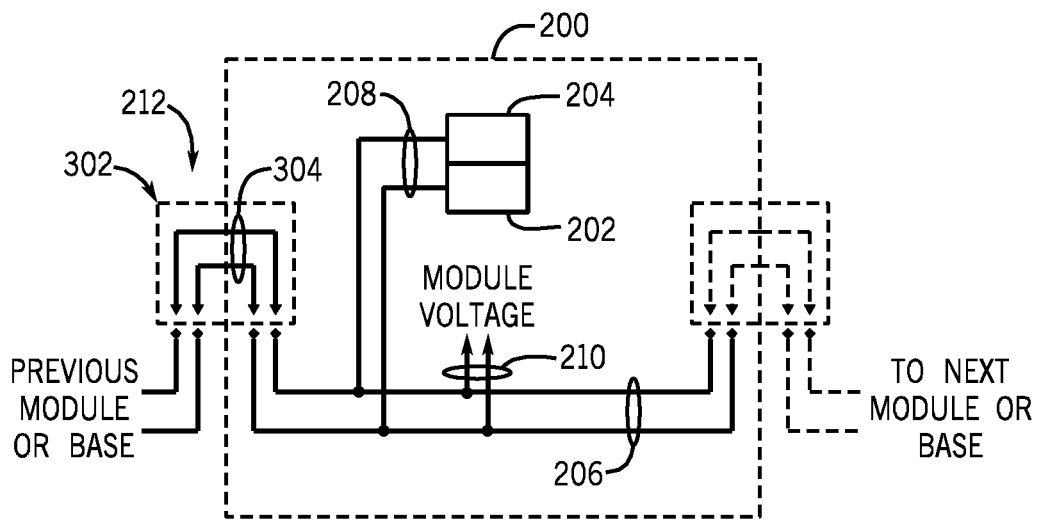
FIG. 8 is a schematic representation of communicative features of an adaptable device in accordance with present techniques, wherein an activation mechanism of the adaptable includes a bridging member.

FIG. 8 is schematic representation of the adaptable device 200 including a bridging member 302 that functions as the activation mechanism 212. The bridging member 302 may be a component of the functional module 224 and/or the base 222. Specifically, the bridging member 302 may include circuitry 304 that communicatively couples the device power bus 206 with an upstream device (e.g., a power distribution module) when it is coupled with the adaptable device 200, and breaks the communicative coupling when it is disengaged from the adaptable device 200. The bridging member 302 may essentially function as a key for converting the adaptable device 200 between modes of operation. In addition to breaking or continuing the device power bus 206 with respect to downstream or upstream devices, the bridging member 302 may also enable other aspects of the different modes of operation of the adaptable device 200. For example, removal of the bridging member 302 may include removal of a cover over the terminals 202, 204 to facilitate access to the terminals 202, 204 and use of the adaptable device 200 as a power distribution device. Further, attachment or removal of the bridging member 302 may provide a visual indication of the mode in which the adaptable device 200 is operating. For example, the bridging member 302 and corresponding mating features on the functional module 224 or base 222 may be prominently positioned and brightly colored to provide a clear indication of its attachment or lack of attachment. Specifically, for example, the bridging member 302 may include large text indicating that the adaptable device 200 is being activated as an I/O module, and the portion of the adaptive device 200 covered by the bridging member 302 may include large text indicating that the adaptable device 200 is being utilized as a power distribution module. Thus, when the bridging member 302 is coupled to the adaptable module, it clearly indicates that the adaptable device 200 is functioning as an I/O module and covers the other text. Likewise, when the bridging member 302 is not present, the text that is not covered by the bridging member 302 clearly indicates that the adaptable device 200 is functioning as a power distribution device. The bridging member 302 may include one or more LEDs or other indicators that can be activated upon proper engagement with the adaptable device 200.

Figure 9:
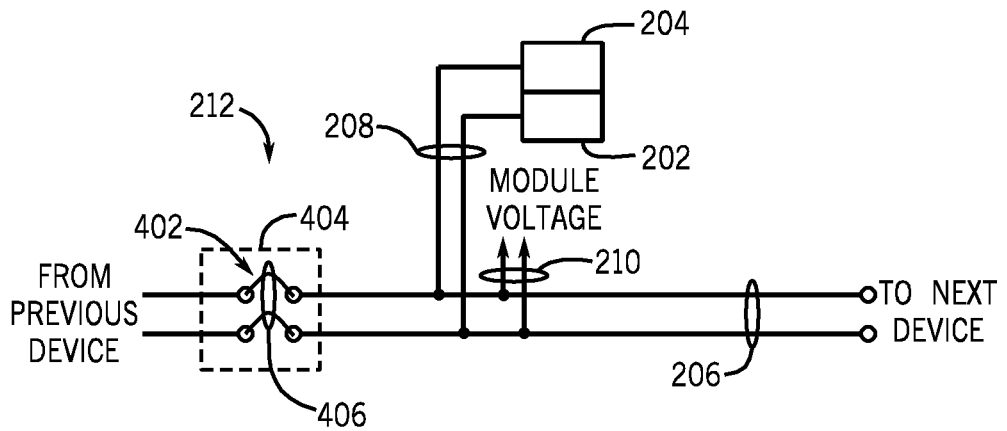
FIG. 9 is a schematic representation of communicative features of an adaptable device in accordance with present techniques, wherein an activation mechanism of the adaptable includes a breakaway circuit.

In yet another embodiment, as illustrated in FIG. 9, the activation mechanism 212 of the adaptable device 200 may include a circuit breakaway section 402 that can be removed from the adaptable device 200 to discontinue communication of the device power bus 206 with upstream devices. Removal of the circuit breakaway section 402 may be referred to as a punch out method of mode activation. The circuit breakaway section 402 may include a tab 404 (e.g., a portion of a plastic housing of the adaptable device 200) with integral circuitry 406 for continuing the device power bus 206 when the circuit breakaway section 402 is in place on the adaptable device 200 or discontinuing the device power bus 206 when removed. The circuitry breakaway section 402 may be configured such that it can be irreversibly broken off of the adaptable device 200 to change the mode of operation of the adaptable device 200 from an I/O device functionality to a power distribution functionality. The circuit breakaway section 402 may be a component of the functional module 224 or the base 222. Unlike reversible embodiments of the present disclosure, once the circuit breakaway section 402 is removed, it essentially cannot be functionally replaced. Thus, once the adaptable module 200 is converted to a particular mode of operation by removing the circuit breakaway section 402, it will generally remain in the mode. However, it should be noted that the component (e.g., the base 222) on which the circuit breakaway section 402 was located may simply be replaced to change the mode of operation of the adaptable device 200 back to a default mode.

Figure 10:
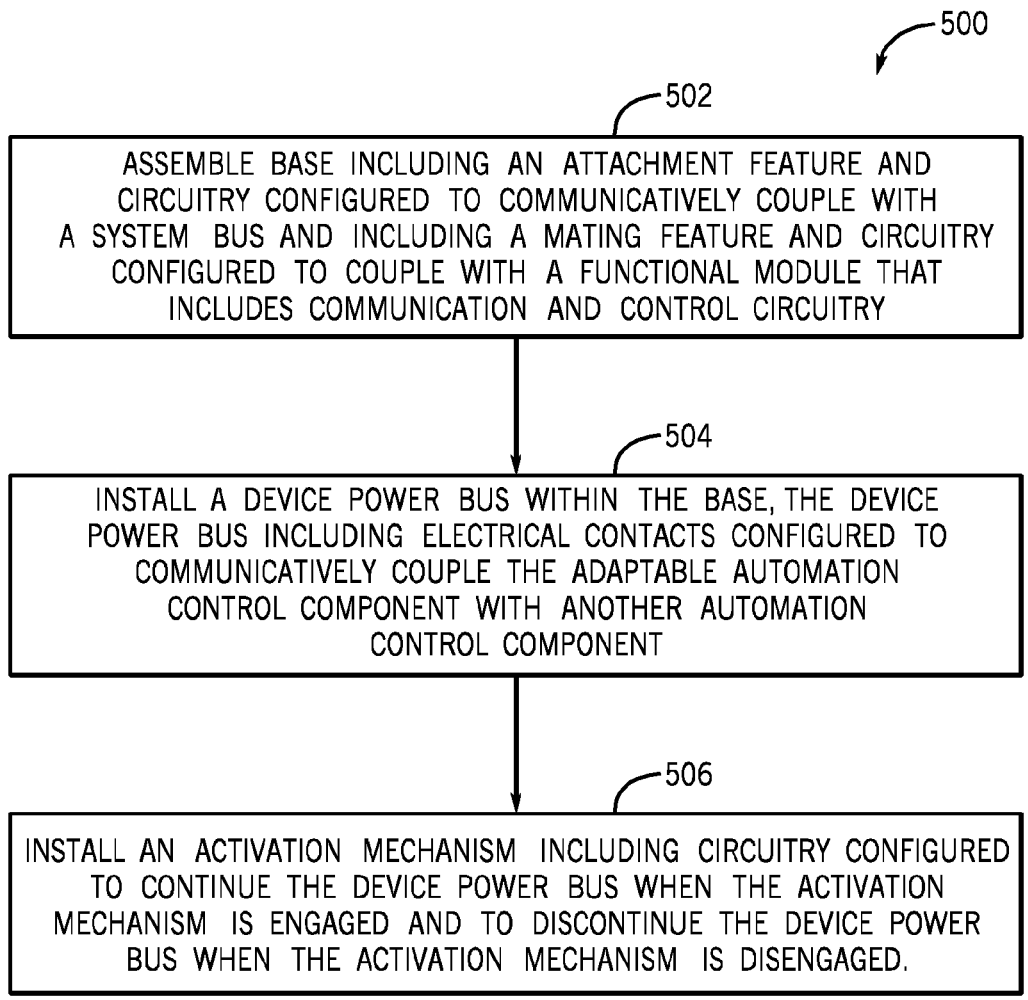
FIG. 10 is a process flow diagram of a method of manufacturing an adaptable automation control component in accordance with present techniques.

FIG. 10 is a process flow diagram of a method of manufacturing an adaptable automation control component (e.g., adaptable device 22) in accordance with present techniques. The process flow diagram is generally indicated by reference numeral 500 and includes various blocks that represent acts or steps in the process. Block 502 represents assembling a base including an attachment feature and circuitry configured to communicatively couple with a system bus. This also includes assembling a mating feature and circuitry configured to couple the base with a functional module that includes communication and control circuitry. Block 504 represents installing a device power bus within the base, wherein the device power bus includes electrical contacts configured to communicatively couple the adaptable automation control component with another automation control component. In other embodiments, the device power bus may be disposed within a functional module. Block 506 represents installing an activation mechanism including circuitry configured to continue the device power bus when the activation mechanism is engaged and to discontinue the device power bus when the activation mechanism is disengaged.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An adaptable automation control component, comprising:
    a base configured to communicatively couple with a system bus and configured to couple with a functional module that includes communication and control circuitry;
    a device power bus including electrical contacts configured to communicatively couple the adaptable automation control component with a separate automation control component; and
    an activation mechanism including circuitry configured to continue the device power bus when the activation mechanism is engaged and to discontinue the device power bus when the activation mechanism is disengaged, the adaptable automation control component being configured to facilitate functionality as an input/output module or a power distribution module depending on whether the activation mechanism is engaged or disengaged.

2. The adaptable automation control component of claim 1, comprising a terminal block communicatively coupled with the base and configured to receive and communicatively couple with field wiring.

3. The adaptable automation control component of claim 2, wherein the terminal block comprises a removable terminal block.

4. The adaptable automation control component of claim 1, wherein the activation mechanism is a component of the base.

5. The adaptable automation control component of claim 1, comprising the functional module including the activation mechanism as a component of the functional module.

6. The adaptable automation control component of claim 1, wherein the activation mechanism comprises a double-pole single throw switch.

7. The adaptable automation control component of claim 1, wherein the activation mechanism comprises a reversible double hermaphroditic switch.

8. The adaptable automation control component of claim 1, wherein the activation mechanism comprises a bridging member configured to be engaged by coupling with and disengaged by detachment from the adaptable automation control component.

9. The adaptable automation control component of claim 1, wherein the activation mechanism comprises a breakaway section of the adaptable automation control that is configured to be disengaged by being broken off of the automation control component.

10. The adaptable automation control component of claim 9, wherein the breakaway section comprises a tab that is integral with a housing of the automation control component.

11. The adaptable automation control component of claim 1, wherein the activation mechanism comprises dedicated terminals configured to receive power from a power source.

12. The adaptable automation control component of claim 11, wherein the dedicated terminals are activated or made accessible based on whether the activation mechanism is engaged or disengaged.

13. The adaptable automation control component of claim 1, comprising a terminal block including terminals that are configured to communicatively couple field wiring with the functional module when the activation mechanism is engaged and configured to communicatively couple a power line with the device power bus when the activation mechanism is disengaged.

14. The adaptable automation control component of claim 1, wherein the device power bus is disposed within the base.

15. An adaptable automation control component, comprising:
    a base configured to communicatively couple with a system bus;
    a functional module integral with the base or configured to communicatively couple with the base via a detachable mating;
    a terminal block configured to communicatively couple the base and functional module with field wiring;
    a device power bus including electrical contacts configured to communicatively couple the adaptable automation control component with other automation control components;
    power terminals on the base or terminal block configured to couple a power source to the device power bus; and an activation mechanism configured to complete the device power bus while the activation mechanism is in a default position such that the adaptable automation control component can function as an input/output module, and configured to break the device power bus while the activation mechanism is in a non-default position such that the adaptable automation control component can function as a power distribution module.

16. The adaptable automation control component of claim 15, wherein the activation mechanism is configured to reversibly move between the default and non-default positions.

17. The adaptable automation control component of claim 15, wherein the activation mechanism is a component of the base and/or a component of the functional module.

18. The adaptable automation control component of claim 15, wherein the activation mechanism comprises a double-pole single throw switch, a reversible double hermaphroditic switch, or a detachable bridging member.

19. The adaptable automation control component of claim 15, wherein power terminals are inoperable or inaccessible when the activation mechanism is in the default position.

20. The adaptable automation control component of claim 19, wherein a physical feature of the activation mechanism blocks access to the power terminals when the activation mechanism is in the default position.

21. A method of manufacturing an adaptable automation control component, comprising:

assembling a base including an attachment feature and circuitry configured to communicatively couple with a system bus and including a mating feature and circuitry configured to couple with a functional module that includes communication and control circuitry;

installing a device power bus within the base, wherein the device power bus includes electrical contacts configured to communicatively couple the adaptable automation control component with another automation control component; and installing an activation mechanism including circuitry configured to continue the device power bus when the activation mechanism is engaged and to discontinue the device power bus when the activation mechanism is disengaged.

22. The method of claim 21, wherein installing the activation mechanism comprises attaching a double-pole single throw switch, a reversible double hermaphroditic switch, or a detachable bridging member to first and second portions of the device power bus such that the first and second portions of the device power bus are capable of being communicatively coupled or decoupled by the activation mechanism.

23. The method of claim 21, wherein assembling the base comprises coupling the mating feature and circuitry with the functional module such that the functional module is integral with the base.

* * * * *